US008227793B2

(12) United States Patent  
Ahn

(10) Patent No.: US 8,227,793 B2  
(45) Date of Patent: *Jul. 24, 2012

(54) PHOTODETECTOR CAPABLE OF DETECTING THE VISIBLE LIGHT SPECTRUM

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 172 days.

This patent is subject to a terminal disclaimer.

(21) Appl. No.: 12/498,204

(22) Filed: Jul. 6, 2009

(65) Prior Publication Data

US 2011/0001124 A1  Jan. 6, 2011

(51) Int. Cl.
*H01L 29/06* (2006.01)
*H01L 31/00* (2006.01)

(52) U.S. Cl. ............ 257/21; 257/257; 257/E31.054; 257/E33.076

(58) Field of Classification Search ............ 257/E31.054, 257/E33.076, 21, 257

See application file for complete search history.

(56) References Cited

U.S. PATENT DOCUMENTS

| 3,990,096 A | 11/1976 | Namizaki et al. |
| 4,764,261 A | 8/1988 | Ondris et al. |
| 5,079,774 A | 1/1992 | Mendez et al. |
| 5,112,410 A | 5/1992 | Chen |
| 5,175,739 A | 12/1992 | Takeuchi et al. |
| 5,181,219 A | 1/1993 | Mori et al. |
| 5,181,221 A | 1/1993 | Mori et al. |
| 5,182,757 A | 1/1993 | Mori et al. |
| 5,287,377 A | 2/1994 | Fukuzawa et al. |
| 5,291,507 A | 3/1994 | Haase et al. |
| 5,295,148 A | 3/1994 | Mori et al. |
| 5,317,584 A | 5/1994 | Mori et al. |
| 5,404,027 A | 4/1995 | Haase et al. |
| 5,404,369 A | 4/1995 | Mori et al. |
| 5,490,953 A | 2/1996 | Morita |
| 5,606,176 A | 2/1997 | Nitta |
| 5,646,419 A | 7/1997 | McCaldin et al. |
| 5,818,072 A | 10/1998 | Schetzina |
| 5,933,444 A | 8/1999 | Molva et al. |
| 6,069,380 A | 5/2000 | Chou et al. |
| 6,515,313 B1 | 2/2003 | Ibbetson et al. |
| 6,627,914 B1 | 9/2003 | Komiyama et al. |
| 6,803,596 B2 | 10/2004 | Hata |
| 6,813,063 B2 | 11/2004 | Ishihara |
| 6,891,329 B2 | 5/2005 | Nagano et al. |
| 7,420,225 B1 | 9/2008 | Wanke et al. |
| 7,638,817 B2 * | 12/2009 | Shur et al. ............ 257/187 |
| 2002/0031153 A1 | 3/2002 | Niwa et al. |
| 2002/0150135 A1 | 10/2002 | Naone et al. |

(Continued)

FOREIGN PATENT DOCUMENTS

JP  09199783  7/1997

(Continued)

OTHER PUBLICATIONS

U.S. Appl. No. 12/472,168, mail date Jul. 21, 2010, Office Action (Continued)

*Primary Examiner* — Daniel Whalen  
(74) *Attorney, Agent, or Firm* — Workman Nydegger

(57) ABSTRACT

Apparatuses capable of and techniques for detecting the visible light spectrum are provided.

24 Claims, 11 Drawing Sheets

U.S. PATENT DOCUMENTS

| | | | |
|---|---|---|---|
| 2004/0058467 | A1 | 3/2004 | Chirovsky et al. |
| 2004/0095978 | A1 | 5/2004 | Cheng et al. |
| 2004/0183087 | A1 | 9/2004 | Gardner |
| 2004/0232412 | A1 | 11/2004 | Burgener, II et al. |
| 2005/0074576 | A1 | 4/2005 | Chaiken et al. |
| 2005/0185686 | A1 | 8/2005 | Rupasov et al. |
| 2005/0285128 | A1 | 12/2005 | Scherer et al. |
| 2007/0063304 | A1* | 3/2007 | Matsumoto et al. ......... 257/462 |
| 2007/0126021 | A1 | 6/2007 | Ryu et al. |
| 2007/0126037 | A1* | 6/2007 | Ikeda ............................ 257/288 |
| 2007/0194297 | A1 | 8/2007 | McCarthy et al. |
| 2007/0298551 | A1 | 12/2007 | Bouvet et al. |
| 2008/0048193 | A1 | 2/2008 | Yoo et al. |
| 2008/0197366 | A1 | 8/2008 | Yoo et al. |
| 2009/0017268 | A1 | 1/2009 | Skipor et al. |
| 2009/0020149 | A1 | 1/2009 | Woods et al. |
| 2009/0114940 | A1 | 5/2009 | Yang et al. |
| 2009/0121628 | A1 | 5/2009 | Cho et al. |
| 2009/0273820 | A1 | 11/2009 | Dionne et al. |
| 2009/0310640 | A1 | 12/2009 | Sato et al. |
| 2010/0096001 | A1 | 4/2010 | Sivananthan et al. |
| 2010/0155696 | A1 | 6/2010 | Duan et al. |
| 2010/0261338 | A1* | 10/2010 | Tsakalakos et al. ......... 438/478 |
| 2010/0276661 | A1 | 11/2010 | Ahn |
| 2010/0301308 | A1* | 12/2010 | Ahn ................................ 257/14 |
| 2010/0301454 | A1 | 12/2010 | Zhang et al. |
| 2010/0326489 | A1 | 12/2010 | Ahn |
| 2011/0001121 | A1 | 1/2011 | Ahn |
| 2011/0001122 | A1 | 1/2011 | Ahn |
| 2011/0001125 | A1* | 1/2011 | Ahn ................................ 257/14 |
| 2011/0043884 | A1* | 2/2011 | Ahn .............................. 359/243 |
| 2011/0095309 | A1 | 4/2011 | Ahn |
| 2011/0114995 | A1 | 5/2011 | Ahn |
| 2012/0040483 | A1 | 2/2012 | Ahn |

FOREIGN PATENT DOCUMENTS

| | | |
|---|---|---|
| JP | 409199783 | 7/1997 |
| JP | 07202340 | 8/2007 |
| WO | WO 2009067347 | 5/2009 |
| WO | WO2009/106583 | 9/2009 |
| WO | WO 2009106583 | 9/2009 |
| WO | WO 2010137865 | 12/2010 |
| WO | WO 2011004990 | 1/2011 |

OTHER PUBLICATIONS

International Search Report and Written Opinion, mailed Sep. 10, 2010, as issued in connection with Patent Application No. PCT/KR2010/004350, filed on Jul. 5, 2010.

U.S. Appl. No. 12/606,880, filed Oct. 27, 2009, Ahn.

Australian Patent Office; International Search Report and Written Opinion in corresponding PCT application (PCT/KR2010/007292); mailed Jan. 26, 2011.

D-M. Yeh, et al "Surface plasmon coupling effect in an InGaN/GaN single-quantum-well light-emitting diode" Appl. Phys. Lett. 91, 171103 (2007).

E. H. Sargent, et al "Lateral Injection Lasers" International Journal of High Speed Electronics and Systems, Dec. 1998, vol. 9, No. 4, pp. 941-978.

R. Paschotta "Encyclopedia of Laser Physics and Technology, vol. 1", Wiley-VCH, 2008, ISBN 3527408282, 9783527408283 p. 595.

S. Bai, et al. "Determination of the electric field in 4H/3C/4H-SiC quantum wells due to spontaneous polarization in the 4H SiC matrix" Appl. Phys. Lett. 83, 3171 (2003).

U.S. Appl. No. 12/472,168, mail date Jun. 18, 2010, Office Action.
U.S. Appl. No. 12/472,168, mail date Jan. 5, 2011, Office Action.
U.S. Appl. No. 12/472,168, mail date Feb. 22, 2011, Notice of Allowance.
U.S. Appl. No. 12/498,228, mail date Sep. 1, 2010, Office Action.
U.S. Appl. No. 12/498,228, mail date Dec. 23, 2010, Office Action.
D. Ahn, et al "Optical Gain and Luminescence of a ZnO-MgZnO Quantum Well" IEEE Photonics Technology Letters, vol. 18, No. 2, Jan. 15, 2006, pp. 349-351.

Liu Liu, et al "Novel surface plasmon waveguide for high integration" Optics Express, vol. 13, No. 17. Aug. 22, 2005, pp. 6645-6650.

I.V. Bradley, et al "Space-charge effects in type-II strained layer superlattices" Journal of Crystal Growth 184/185 (1998), pp. 728-731.

Koichi Okamoto, et al "Surface-plasmon-enhanced light emitters based on InGaN quantum wells" Nature Materials, vol. 3, Sep. 2004, pp. 601-605.

K. Leosson, et al "Long-range surface plasmon polariton nanowire waveguides for device applications" Optics Express, vol. 14, No. 1, Jan. 9, 2006, pp. 314-319.

A. Jia, et al "Design of new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.

Arup Neogi, et al "Enhancement of spontaneous recombination rate in a quantum well by resonant surface plasmon coupling" Pysical Review B 66, 153305 (2002).

Seoung-Hwan Park, et al "Spontaneous and piezoelectric polarization effects in wurtzite ZnO/MgZnO quantum well lasers" Applied Physics Letters 87, 253509 (2005).

Sergey I. Bozhevolnyi, et al "Channel Plasmon-Polariton Guiding by Subwavelength metal Grooves" Physical Review Letters, PRL 95, 046802 (2005) week ending Jul. 22, 2005.

P.I. Kuznetsov, et al "Hexagonal ZnCdS epilayers and CdSSE/ZnCdS QW structures on CdS(0001) and ZnCdS (0001) substrates grown by MOVPE" Physica E 17 (2003), pp. 516-517.

Seoung-Hwan Park, et al "Optical gain in InGaN/InGaAlN quantum well structures with zero internal field" Applied Physics Letters, vol. 92, 171115 (2008) pp. 171115-1-171115-3.

Chul Huh, et al., "Improvement in light-output efficiency of InGaN/GaN multiple-quantum well light-emitting diodes by current blocking layer", Appl. Phys., vol. 92, No. 5, Sep. 1, 2002, 2248-2250, American Institute of Physics.

Seong-Ran Jeon, et al., "GaN tunnel junction as a current aperture in a blue surface-emitting light-emitting diode", Appl. Phys. Lett., vol. 80, No. 11, Mar. 18, 2002, 1933-1935, American Institute of Physics.

Seoung-Hwan Park, et al., "Crystal-orientation effects on the piezoelectric field and electronic properties of strained wurtzite semiconductors", vol. 59, No. 7, Feb. 15, 1999, 4725-4737, The American Physical Society.

Seoung-Hwan Park, "Crystal Orientation Effects in Electronic Properties of Wurtzite GaN/AlGaN Quantum Wells with Spontaneous and Piezoelectric Polarization", Jpn. J. Appl. Phys. vol. 39, Part 1, No. 6A, Jun. 2000, 3478-3482, The Japan Society of Applied Physics.

P. Waltereit, et al., Nitride semiconductors free of electrostatic fields for efficient white light-emitting diodes, Nature, vol. 406, Aug. 24, 2000, 865-868, Macmillan Magazines Ltd.

D. Ahn, et al., "A field-effect quantum-well laser with lateral current injection", J.Appl. Phys. 64(1), Jul. 1, 1988, 440-442, American Institute of Physics.

Hyunsoo Kim, et al., "Lateral current transport path, a model for GaN-based light-emitting diodes: application to practical device designs", Appl. Phys. Lett., vol. 81, No. 7, Aug. 12, 2002, 1326-1328, American Institute of Physics.

Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.

U.S. Appl. No. 12/606,880, mail date Apr. 29, 2011, Office Action.

Hetterich, J., et al, Optimized Design of Plasmonic MSM Photodetector, IEEE Journal of Quantum Electronics, Oct. 2007, vol. 43, No. 10, pp. 855 to 859.

Taguchi, T., et al., Ultraviolet Laser and Photodetector of CdZnS/ZnS Multiple Quantum Wells, Physics B. 1993, vol. 191, pp. 136 to 139.

Yu, E. T., et al., Plasmonic Nanoparticle Scattering for Enhanced Performance of Photovoltaic and Photodetector Devices, Proceedings of SPIE, Aug. 28, 2008, vol. 7033, Plasmonics: Nanoimaging, Nanofabrication and their Applications IV, pp. 70331V-1 to 70331V-9.

Sumith, B. et al., Quantum Well Infrared Photodectors for Long Wavelength Infrared Applications, Proceedings of SPIE, Oct. 1998, vol. 3436, Infrared Technology and Applications XXIV, pp. 280 to 284.

Seoung-Hwan Park, et al "Many-body optical gain of wurtzite GaN-based quantum-well lasers and comparison with experiment" Appl. Phys. Lett. 72 (3), Jan. 19, 1998, pp. 287-289.

Seoung-Hwan Park, et al "Piezoelectric effects on electrical and optical properties of wurtzite GaN/AlGaN quantum well lasers" Applied Physics Letters vol. 72, No. 24, Jun. 15, 1998, pp. 3103-3105.

Seoung-Hwan Park, et al "Many-body optical gain and intraband relaxation time of wurtzite InGaN/GaN quantum-well lasers and comparison with experiment" Applied Physics Letters 87, 044103 (2005).

Jie Liu, et al "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.

Doyeol Ahn, et al "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.

Doyeol Ahn "Theory of Non-Markovian Gain in Strained-Layer Quantum-Well Lasers with Many-Body Effects" IEEE Journal of Quantum Electronics, vol. 34, No. 2, Feb. 1998, pp. 344-352.

Yifei Zhang, et al "Charge control and mobility studies for an AiGan/GaN high electron mobility transistor" Journal of Applied Physics, vol. 85, No. 1, Jan. 1, 1999, pp. 587-594.

Tsung-Hsing Yu, et al "Theoretical study of the two-dimensional electron mobility in strained III-nitride heterostructures" Journal of Applied Physics, vol. 89, No. 7, Apr. 1, 2001, pp. 3827-3834.

D. Ahn, et al "Electric field dependence of instrasubband polar-optical-phonon scattering in a quantum well" Physical Review B, vol. 37, No. 5, Feb. 15, 1988-I, pp. 2529-2535.

Doyeol Ahn "Time-convolutionless reduced-desnsity-operator theory of an arbitrary driven system coupled to a stochastic reservoir: Quantum kinetic equations for semiconductors" Physical Review B, vol. 50, No. 12, Sep. 1994-II, pp. 8310-8318.

Doyeol Ahn "Time-convolutionless reduced-desnsity-operator theory of an arbitrary driven system coupled to a stochastic reservoir. II. Optical gain and line-shape function of a driven semiconductor" Physical Review B, vol. 51, No. 4, Jan. 15, 1995-II, pp. 2159-2166.

Seoung-Hwan Park, et al "Crystal-orientation effects on the piezoelectric field and electronic properties of strained wurtzite semiconductors" Physical Review B, vol. 59, No. 7, Feb. 15, 1999-I, pp. 4725-4737.

International Search Report and Written Opinion, mailed Aug. 10, 2010, as issued in connection with Patent Application No. PCT/KR2010/003322, filed on May 26, 2010.

U.S. Appl. No. 12/498,265, mail date May 17, 2011, Office Action.
U.S. Appl. No. 12/498,228, mail date, Jul. 12, 2011, Office Action.
Siliconfareast.com; "Lattice Constants"; http://www.siliconfareast.com/lattice_constants.htm; 2 pages; retrieved Oct. 7, 2011.
Wikipedia; "Wurtzite crystal structure", http://en.wikipedia.org/wiki/Wurtzite_crystal_structure; 1 page; retrieved Oct. 7, 2011.
Al-Salim, Najeh, Synthesis of CdSeS Nanocrystals in Coordinating and Noncoordinating Solvents: Solvent's Role in Evolution of the Optical and Structural Properties, Mar. 26, 2007.
B. Ullrich, Semiconductor Science and Technology "Green emission and bandgap narrowing due to two-photon excitation in thin film CdS formed by spray pyrolysis", published Jun. 22, 2011.
J. Ueno, et al. "MBE growth of AnSe/MgCdS and ZnCdS/MgCdS superlattices for UV-A sensors" Phys. Stat. Sol. (c) 3, No. 4, pp. 1225-1228 (2006).
U.S. Appl. No. 12/472,168, mail date Aug. 18, 2011, Notice of Allowance.
U.S. Appl. No. 12/472,168, mail date Sep. 1, 2011, Notice of Allowance.
U.S. Appl. No. 12/498,265, mail date Aug. 26, 2011, Office Action.
U.S. Appl. No. 12/606,880, mail date Aug. 15, 2011, Notice of Allowance.
U.S. Appl. No. 12/498,228, mail date Dec. 15, 2011, Notice of Allowance.
U.S. Appl. No. 12/498,257, mail date Nov. 23, 2011, Office Action.
U.S. Appl. No. 12/606,880, mail date Nov. 17, 2011, Notice of Allowance.

Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.

Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.

LEDs Magazine, "Goldeneye sets brightness benchmark for green LEDs", http://www.ledsmagazine.com/news/5/5/18, May 15, 2008, 2 pages.

Smith S.J. et al., "Lateral light emitting n-i-p diodes in InSb/AlxIn1—xSb quantum wells," Applied Physics Letters, vol. 89, p. 111118 (2006), 3 pages.

U.S. Appl. No. 12/498,265, mail date Feb. 28, 2012, Office Action.
U.S. Appl. No. 12/606,880, mail date Feb. 16, 2012, Notice of Allowance.

"II-VI solar cells moving to the production phase," Photovoltaics Bulletin., (2003), vol. 2003, No. 11, Oct. 2003, pp. 10-12.

Andreani, Lucio Claudio, et al, Exchange interaction and polariton effects in quantum-well excitons, Physical Review B, vol. 41, No. 11, pp. 7536-7544 (1990).

Angelakis, D. G., et al., "Photon-blockade-induced Mott transitions and XY spin models in coupled cavity arrays," Phys. Rev. A76, 031805 (2007).

Chu, T.L., and Chu, S.S., "Thin film II-VI photovoltaics," vol. 38, Issue 3, Mar. 1995, pp. 533-549.

Compaan, A. D., et al., "Sputtered II-VI Alloys and Structures for Tandem PV," Subcontract Report NREL/SR-520-43954, Sep. 2008, pp. 64.

Gogolin, O., et al., Temperature dependence of exciton peak energies in Cui quantum dots, Solid State Communications, vol. 122, pp. 511-513 (2002).

Goosen, K.W., "Excitonic electroabsorption in extremely shallow quantum wells," Appl. Phys. Lett., vol. 57, Issue 24, pp. 2582-2584, published Oct. 1, 1990.

Greentree, A.D., et al., "Quantum phase transitions of light," Nature Physics 2, pp. 856-861 (2006).

Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.

Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).

Klimov, V.I., et al., "Optical Gain and Stimulated Emission in Nanocrystal Quantum Dots," Science, Oct. 13, 2000, vol. 290, No. 5490, pp. 314-317.

Little, R. B., et al., "Formation of quantum-dot quantum-well heteronanostructures with large lattice mismatch: ZnS/CdS/ZnS" Journal of Chemical Physics, vol. 114, No. 4, 2001, pp. 1813-1822.

Masumoto, Y., et al., "Observation of persistent spectral hole burning in CuBr quantum dots," Physical Review B, vol. 52, No. 7, pp. 4688-4691 (1995).

Obloh, H., "Group III-nitride based blue emitters," Advances in Solid State Physics, vol. 38, 15-28 (1999).

Park, S.-H., et al., "Internal field engineering in CdZnO/MgZnO quantum well structures," Applied Physics Letters, vol. 94, Issue:8, pp. 083507, 1-3 (2009).

Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.

Tassone, F., et al, "Quantum-well reflectivity and exciton-polariton dispersion," Physical Review B, vol. 45, No. 11, pp. 6023-6030 (1992).

Valenta, J., et al., "Hole-filling of persistent spectral holes in the excitonic absorption band of CuBr quantum dots," Applied Physics Letters, vol. 70, No. 6, pp. 680-682 (1997).

Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).

Hernández, F. E. et al., "High Performance Optical Limiter," accessed at http://web.archive.org/web/20050429144449/http://www.ieee.org/organizations/pubs/newsletters/leos/dec00/high.htm, accessed on May 7, 2012, pp. 5.

Shakya, J., et al., "Switching characteristics of III-Nitride blue/green micro-LEDs," The Smithsonian/NASA Astrophysics Data System, American Physical Society, Annual Mar. Meeting, Mar. 12-16, 2001.

S. X. Jin, et al., "Size dependence of III-nitride microdisk light-emitting diode characteristics," Applied Physics Letters, May 28, 2001, vol. 78, No. 22, pp. 3532-3534.

International Search Report and Written Opinion for International Application No. PCT/KR2010/002649 mailed on Jul. 26, 2010.

International Search Report and Written Opinion for International Application No. PCT/KR2010/005600 mailed on Oct. 22, 2010.

International Search Report and Written Opinion for International Application No. PCT/KR2010/008118 mailed on Feb. 11, 2011.

U.S. Appl. No. 12/472,168, mail date Mar. 29, 2012, Notice of Allowance.

U.S. Appl. No. 13/485,241, filed May 31, 2012, Ahn.

U.S. Appl. No. 12/472,168, mail date May 29, 2012, Notice of Allowance.

U.S. Appl. No. 12/606,880, mail date May 23, 2012, Notice of Allowance.

\* cited by examiner

TRANSPARENT GATE TURNED OFF ⇒ TRANSPARENT GATE TURNED ON

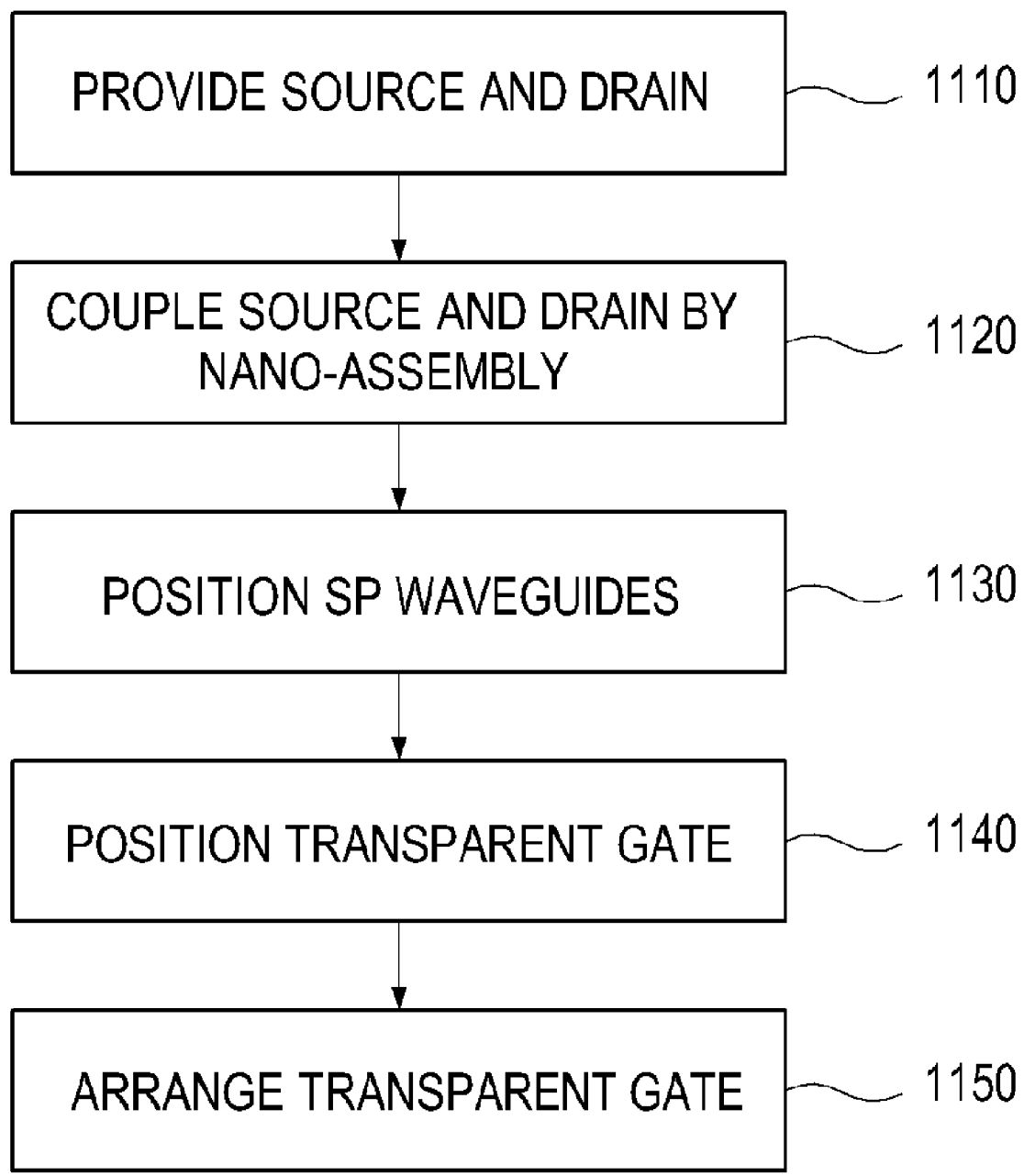

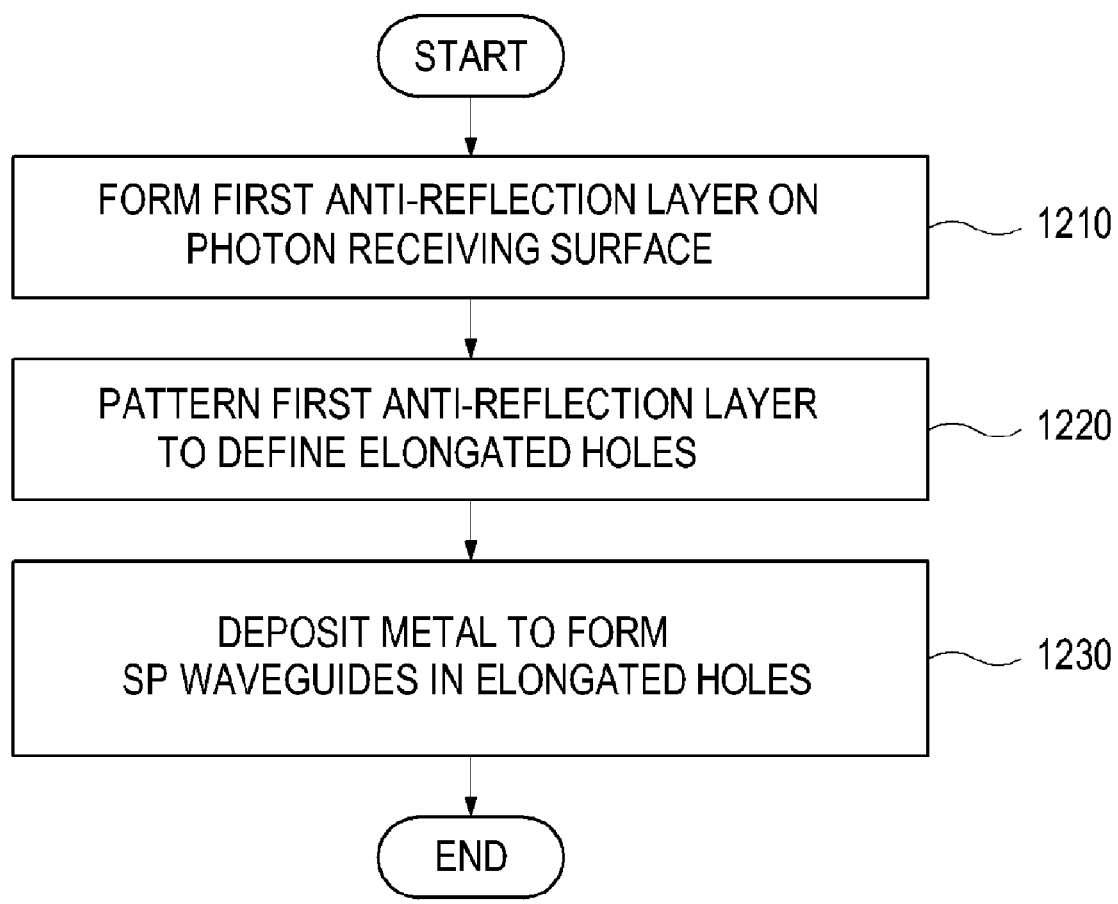

PHOTODETECTOR CAPABLE OF DETECTING THE VISIBLE LIGHT SPECTRUM

CROSS REFERENCE TO RELATED APPLICATION

This application is related to U.S. patent application Ser. No. 12/498,228 filed Jul. 6, 2009, to U.S. patent application Ser. No. 12/472,168 filed May 26, 2009, to U.S. patent application Ser. No. 12/498,265 filed Jul. 6, 2009, to U.S. patent application Ser. No. 12/498,257 filed Jul. 6, 2009, and to U.S. patent application Ser. No. 12/606,880 filed Oct. 27, 2009.

BACKGROUND

The portion of the electromagnetic spectrum visible to humans is called the visible light spectrum. Detection of the visible light spectrum is useful in various fields of technology. For example, photodetectors for detecting the visible light spectrum can be used in medical equipment, display devices, automotive electronics, household appliances, etc. As nano-technology involving the design of nano-scale electronics including optical devices and photodetectors (i.e., structures having a size of about 100 nm or smaller) continues to develop, it is envisioned that advances in nano-technology may be applied to the design of such nano-scale electronics (i.e., optical devices and photodetectors) for improved efficiency and detection.

SUMMARY

Apparatuses capable of and techniques for detecting the visible light spectrum (e.g., red, blue, green spectrum light) are provided. In an illustrative embodiment, by way of non-limiting example, a photodetector capable of detecting the visible light spectrum includes a source disposed on a proximal end of an insulation layer, a drain disposed on a distal end of the insulation layer, at least one nano-assembly coupling the source and the drain between the proximal and distal ends, at least two surface plasmon waveguides positioned between the source and the drain and juxtaposed to the at least one nano-assembly in a longitudinal direction of the at least one nano-assembly, and a transparent gate positioned in proximity to the at least one nano-assembly and the at least two surface plasmon waveguides and further being arranged so as to extend substantially parallel to at least one of the source and drain, and wherein one of the at least two surface plasmon waveguides is positioned along a first side of the at least one nano-assembly, and another of the at least two surface plasmon waveguides is positioned along a second side of the at least one nano-assembly that is opposite the first side.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 11 shows a flow diagram of an illustrative embodiment of a method for providing a photodetector that detects the visible light spectrum.

FIG. 12 shows a flow diagram of an illustrative embodiment of a method for providing SP waveguides.

DETAILED DESCRIPTION

Figure 1:
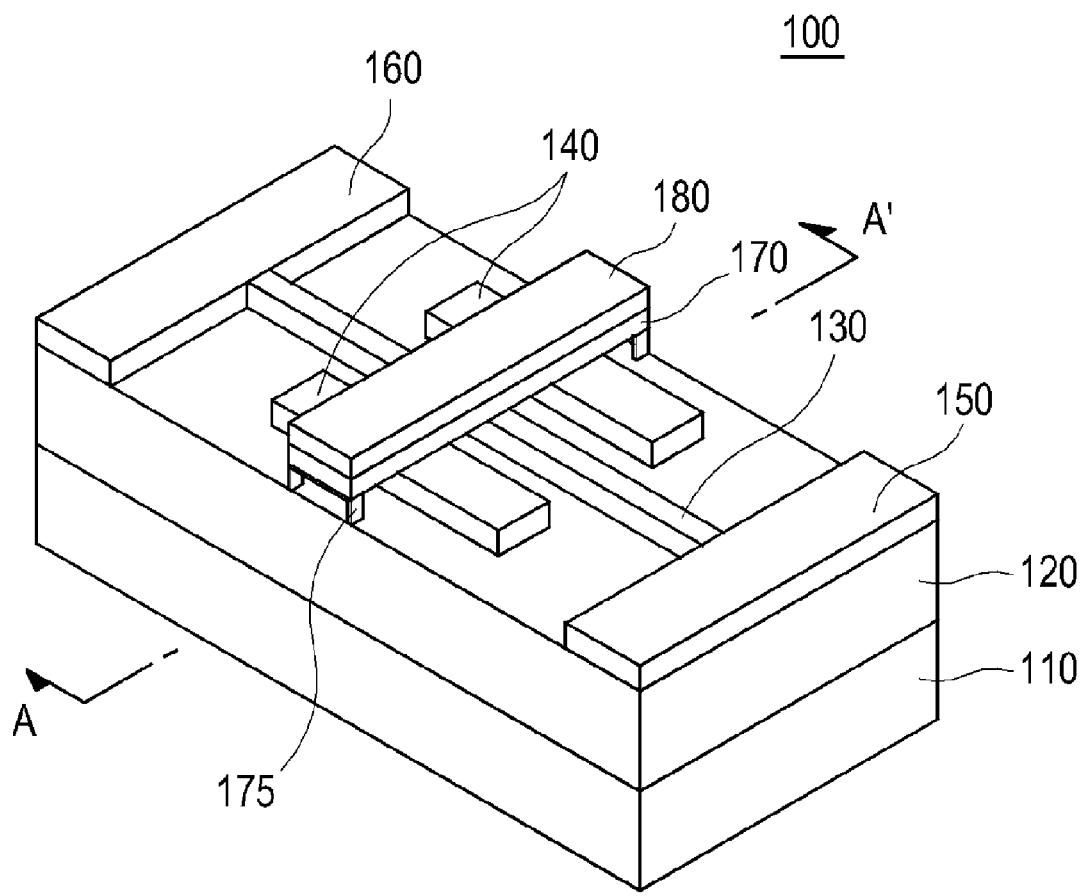
FIG. 1 shows a perspective view of an illustrative embodiment of a photodetector.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a perspective view of an illustrative embodiment of a photodetector 100 that may be used to detect the visible light spectrum. As depicted in FIG. 1, photodetector 100 may be formed on a stacked structure of a substrate 110 and an insulation layer 120. Further, a nano-assembly 130, surface plasmon waveguides (hereinafter referred to as "SP waveguides") 140, a source 150 and a drain 160 may be arranged on insulation layer 120. Source 150 and drain 160 may be disposed on proximal and distal ends of the stacked structure, respectively. For example, source 150 and drain 160 may be disposed on proximal and distal ends of insulation layer 120, respectively. When incident light (i.e., a photon with a specific energy) is received by photodetector 100, an electron in nano-assembly 130 may absorb the energy of the photon, by which nano-assembly 130 operates as a channel to interconnect source 150 and drain 160. In this case, predetermined current may flow in an external circuit (not shown) coupled to photodetector 100. SP waveguides 140 function to allow a photon (i.e., incident light) to be effectively confined around nano-assembly 130.

SP waveguides 140 may be positioned between source 150 and drain 160 and juxtaposed to nano-assembly 130 in a longitudinal direction of nano-assembly 130. Further, one SP waveguide 140 may be positioned along a first side of nano-assembly 130 and another SP waveguide 140 may be positioned along a second side of nano-assembly 130 that is opposite the first side, defining at least some space between SP waveguides 140 and nano-assembly 130, which may be several to thousands of nanometers. The alternating arrangement of nano-assembly 130 and SP waveguides 140 provides an interface to receive photons from incident light and allows the photons to be effectively confined around nano-assembly 130 between SP waveguides 140, as will be further described below in conjunction with FIG. 6. In one embodiment, the space between SP waveguides 140 and nano-assembly 130 may be filled with a dielectric material such as porcelain (ceramic), mica, glass, plastics, the oxides of various metals, or air, but may include any type of dielectric material.

A transparent gate 180 may be formed above or substantially on top of nano-assembly 130 and SP waveguides 140. An insulation layer 170 may be positioned between transparent gate 180 and nano-assembly 130 (or SP waveguide 140). Although it is shown in FIG. 1 that insulation layer 170 and transparent gate 180 are arranged above nano-assembly 130 and SP waveguides 140 by using supporting members 175, any variety of other suitable structures may be adopted to place insulation layer 170 and transparent gate 180 on nano-assembly 130 and SP waveguides 140. Transparent gate 180 may be positioned substantially perpendicular to nano-assembly 130 and SP waveguide 140 and substantially parallel to the elongated direction of source 150 or drain 160. Transparent gate 180 may be arranged in proximity to at least one nano-assembly 130 and at least two SP waveguides 140 so as to extend substantially parallel to at least one of source 150 and drain 160. Transparent gate 180 functions to reduce the internal field of nano-assembly 130 caused by spontaneous polarization (as will be further described in detail below) of nano-assembly 130.

Figure 2:
FIG. 2 shows the visible light spectrum that may be detected in an illustrative embodiment.

FIG. 2 illustrates the range of wavelengths in the visible light spectrum that may be detected by photodetector 100. As shown in FIG. 2, the visible light spectrum corresponds to a wavelength range of about 380 to about 780 nm (e.g., corresponding to a color spectrum ranging from violet through red). For example, visible blue light, visible green light, and visible red light have wavelengths of about 450 nm, about 520 nm, and about 650 nm, respectively. Photodetector 100 may detect the visible light spectrum by measuring interband transition of electrons in nano-assembly 130.

Figure 3:
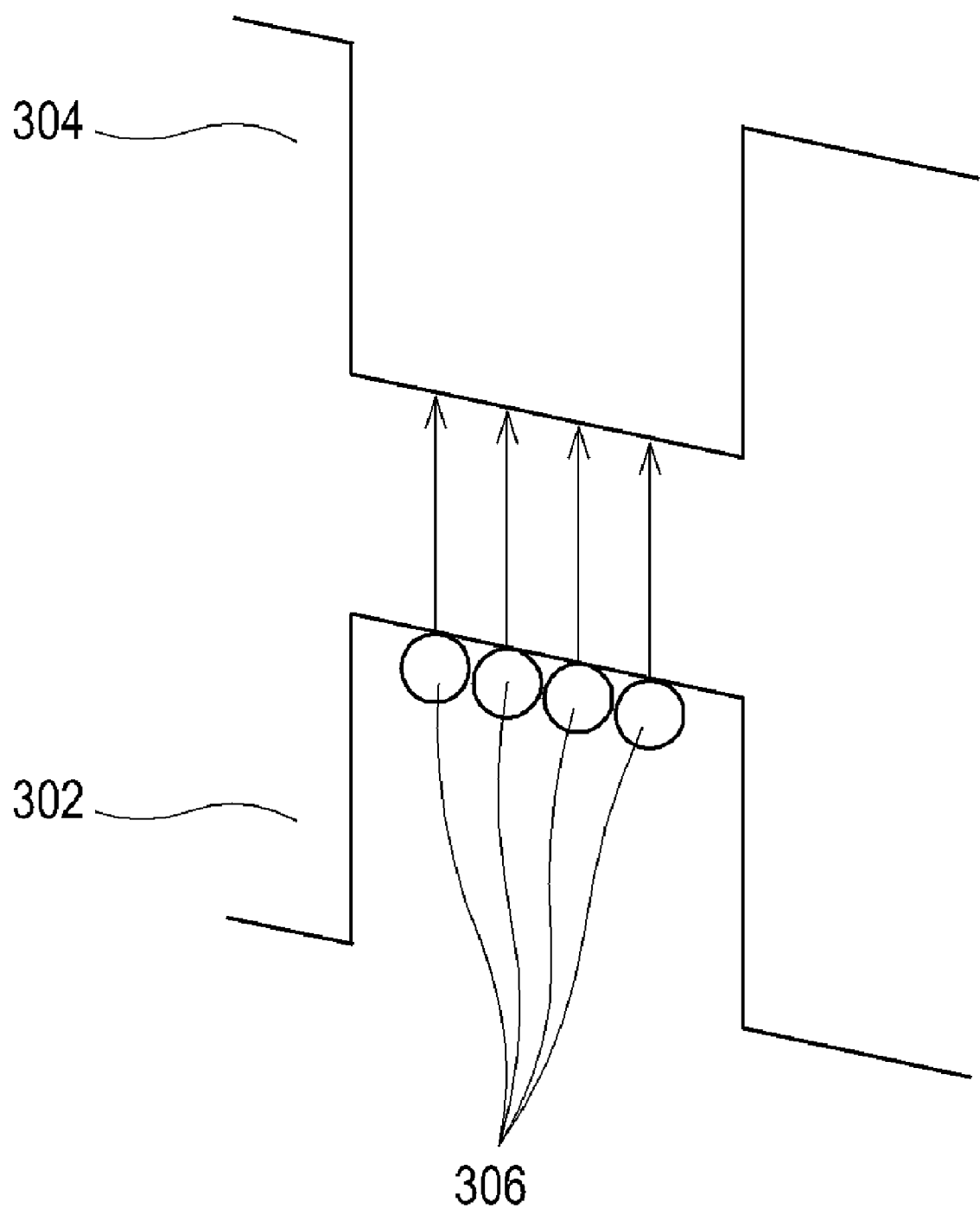
FIG. 3 shows a conceptual view of an illustrative embodiment of an interband transition in a nano-assembly.

FIG. 3 is a conceptual view of an illustrative embodiment of an interband (i.e., band-to-band) transition of electrons between a valence band 302 and a conduction band 304 in nano-assembly 130. When a photon having an energy corresponding to the band gap energy between valence band 302 and conduction band 304 impinges on nano-assembly 130, electrons 306 in valence band 302 may transition to conduction band 304. The transition of electrons 306 from valence band 302 to conduction band 304 (band-to-band transition) causes an electric current to flow through photodetector 100.

Figure 4:
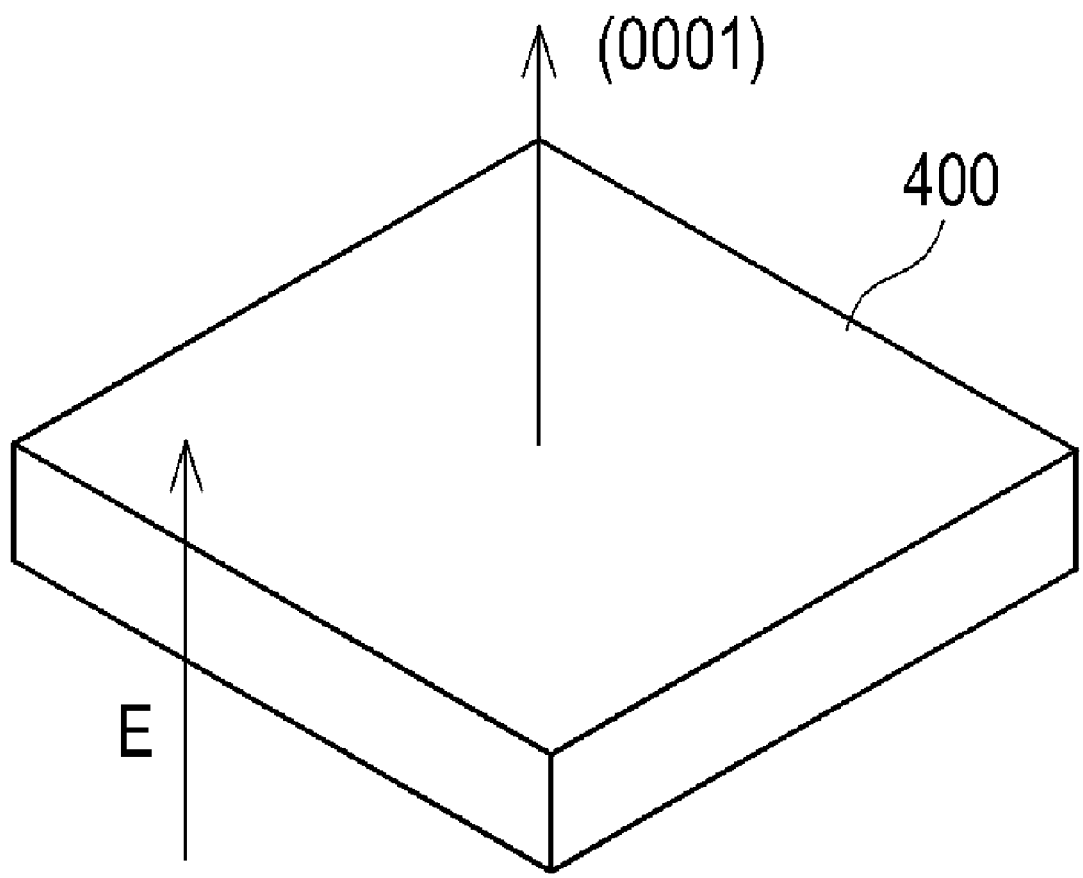
FIG. 4 shows an illustrative embodiment of the structure of a ZnO nanobelt.

FIG. 4 illustrates the basic structure of a ZnO nanobelt 400, which may have a width of about 100 nm and a thickness of about 10 nm. As shown in FIG. 4, the side faces of ZnO nanobelt 400 may include (0001) polar surfaces. In this case, owing to the positive and negative ionic charges on (0001) polar surfaces respectively, spontaneous polarization is induced across ZnO nanobelt 400. As a result, there is an internal field (E) formed along (0001) direction, which minimizes the total energy contribution by spontaneous polarization and degrades the optical transition probability. As shown in FIG. 1, transparent gate 180 may be provided to compensate the internal field (E) in nano-assembly 130 by being arranged above or substantially on top of nano-assembly 130.

In one embodiment, insulation layer 170 may be positioned between nano-assembly 130 (and/or SP waveguides 140) and transparent gate 180.

Figure 5:
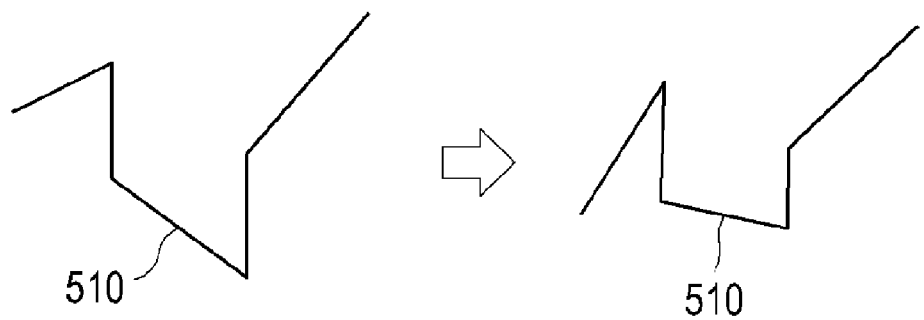
FIG. 5 shows an illustrative embodiment of energy band diagrams of a nano-assembly of a photodetector.

FIG. 5 shows an illustrative embodiment of energy band diagrams of nano-assembly 130 of photodetector 100. The energy band diagram on the left portion in FIG. 5 shows a conduction band in nano-assembly 130 that is obtained if transparent gate 180 does not exist (i.e., is not present) in photodetector 100. Further, the energy band diagram on the right portion of FIG. 5 shows a conduction band in nano-assembly 130 that is obtained if transparent gate 180 does exist (i.e., is present) in photodetector 100. Comparing the two diagrams to each other, an inclination 510 of the energy band diagram (i.e., a lower bound of the conduction band) becomes smaller when transparent gate 180 is provided in photodetector 100 because the internal field in nano-assembly 130 resulting from spontaneous polarization is weakened by applying reverse voltage to transparent gate 180 above or substantially on top of nano-assembly 130. A reverse voltage opposing the direction of the internal field (E) in nano-assembly 130 may be applied from an external circuit (not shown) to transparent gate 180, thereby cancelling the internal field of nano-assembly 130.

Figure 6:
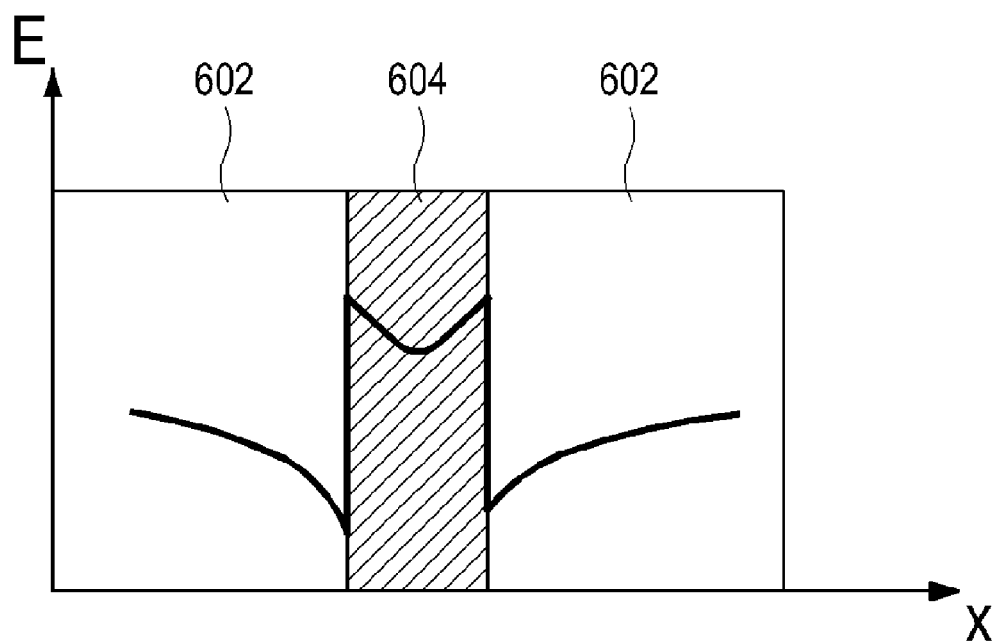
FIG. 6 is a graph showing electric field intensity of photons confined in an interface of an illustrative embodiment of the photodetector.

FIG. 6 illustrates a graph showing electric field intensity of photons confined in an interface of photodetector 100, which includes SP waveguides 140 and nano-assembly 130 arranged between SP waveguides 140. In FIG. 6, while regions 602 corresponding to SP waveguides 140 include metal material, a region 604 corresponding to nano-assembly 130 includes dielectric material, as also shown in FIG. 1. Further, while the x-axis indicates the horizontal position of nano-assembly 130 and SP waveguides 140, the y-axis indicates electric field intensity. The graph shown in FIG. 6 illustrates that a substantial portion of the optical field produced by incident light (i.e., photons) is confined within region 604. The electric field confined between regions 602 and region 604 may be explained by Equation 1 shown below.

$$\frac{D_{x\_dielectric}}{D_{x\_metal}} = \frac{\varepsilon_{dielectric} E_{x\_dielectric}}{\varepsilon_{metal} E_{x\_metal}} = 1 \quad \text{[Equation 1]}$$

$$\therefore \frac{E_{x\_dielectric}}{E_{x\_metal}} = \frac{\varepsilon_{metal}}{\varepsilon_{dielectric}}$$

Where $D_{x\_metal}$ and $D_{x\_dielectric}$ respectively refer to electric displacement fields in region 602 (corresponding to metal material included in SP waveguides 140) and region 604 (corresponding to dielectric material included in nano-assembly 130), $E_{x\_metal}$ and $E_{x\_dielectric}$ respectively refer to electric fields in region 602 and region 604, and $\varepsilon_{metal}$ and $\varepsilon_{dielectric}$ respectively refer to the permittivity of region 602 and region 604. In Equation 1, since the value of $\varepsilon_{metal}$ is much greater than the value of $\varepsilon_{dielectric}$, $E_{x\_dielectric}$ becomes greater than $E_{x\_metal}$, which means that a substantial portion of the optical field is confined within region 604.

Referring to FIG. 6 and Equation 1, the electric field of the incident photons confined between SP waveguides 140 (i.e., nano-assembly 130) is substantially proportional to the ratio between the permittivity of SP waveguides 140 and the permittivity of nano-assembly 130 (and/or dielectric material filled between SP waveguides 140). Thus, the desired confinement of the electrical field may be obtained by selecting material(s) of appropriate permittivity for SP waveguides 140 and/or nano-assembly 130, even in the case where the width of nano-assembly 130 and/or the height of SP waveguides 140 are smaller than the wavelength of incident photons. In such an embodiment, SP waveguides 140 may be fabricated from one or more various types of metals. As shown in Equation 2 below, the permittivity $\in_{metal}$ of a metal is a function of frequency and, thus, the type of metal used may depend on the frequency of the photons that are to be detected by photodetector 100. The types of metal may be chosen based on the spectrum range to be detected by photodetector 100. In one embodiment, a compound such as Ag, Al, Au, Ni, Ti, or any other appropriate metal may be selected for visible light spectrum detection.

$$\varepsilon_{metal}(\omega) = 1 - \frac{\omega_p^2}{\omega^2} \quad \text{[Equation 2]}$$

where symbol $\omega_p$ represents plasma frequency of collective oscillations of the free conduction electrons.

Figure 7:
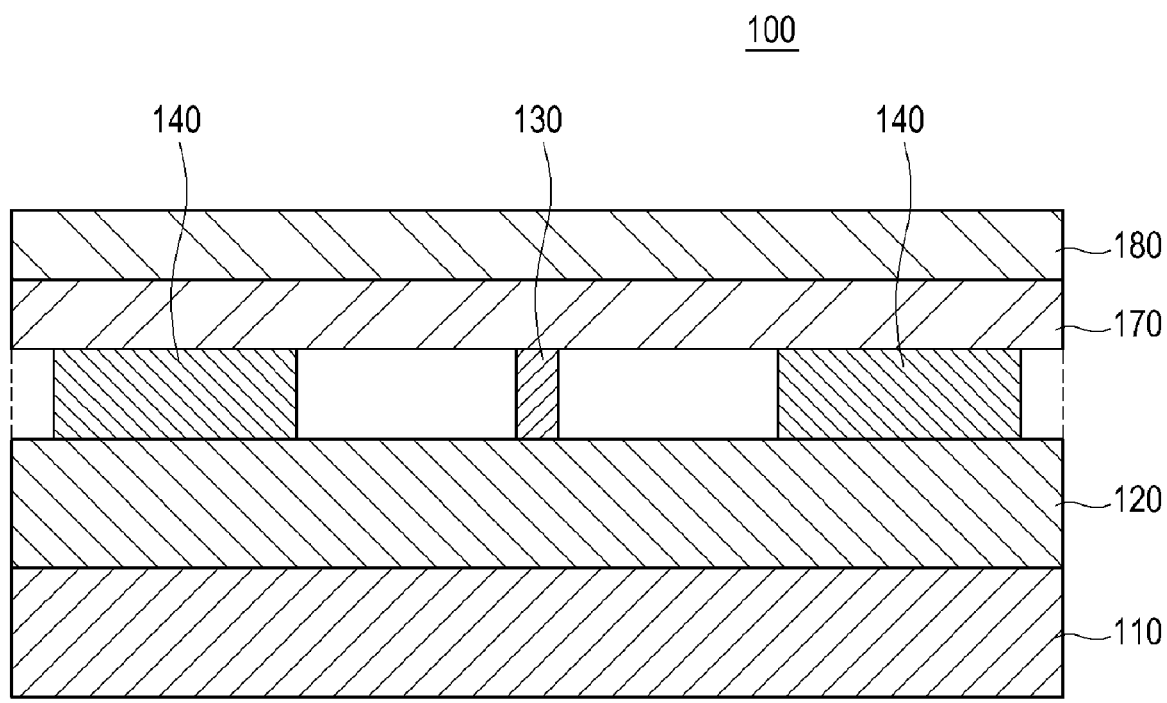
FIG. 7 shows a cross-sectional view of the illustrative embodiment of the photodetector of FIG. 1.

FIG. 7 shows a cross-sectional view of photodetector 100 taken along line A-A' in FIG. 1. In FIG. 7, the cross-sectional dimensions of nano-assembly 130 are on the nanometer scale. In some embodiments, nano-assembly 130 may have a width from about 10 nm to about 500 nm, such as about 10 nm, about 20 nm, about 50 nm, about 100 nm, about 200 nm, or about 500 nm, and a length from about 0.5 μm to about 5 μm, such as about 0.5 μm, about 1 μm, about 2 μm, about 3 μm, about 4 μm, or about 5 μm. In other embodiments, nano-assembly 130 may have a width from about 30 nm to about 300 nm, a width-to-thickness ratio from about 5 to about 10, and a length of up to a few millimeters. The width and length of nano-assembly 130 may be varied substantially in various embodiments. Nano-assembly 130 may be a nano-wire, a nano-belt, a nano-rod, etc. In some embodiments, the thickness of SP waveguide 140 ranges from about 2 μm to about 3 μm to obtain a fine confinement of the photons. Although SP waveguide 140 is shown as having a rectangular shape in FIGS. 1 and 7, the shape and dimensions of SP waveguide 140 may be varied according to each application. For example, each of SP waveguides 140 may have a slab, a rib, or a ridge shape for use in photodetector 100.

In one embodiment, source 150 and drain 160 may include any metal, silicide, or semiconductors such as silicon, germanium, II-VI semiconductor compounds, or III-V semiconductor compounds. Examples of applicable II-VI semiconductor compounds may include CdS, CdSe, CdTe, ZnS, ZnSe, ZnTe, HgS, HgSe, HgTe, CdZnSe, CdSSe, or ZnSSe, and examples of III-V semiconductor compounds may include GaAs, InP, GaP, AlGaAs, or GaN. Substrate 110 may include glass, silicon, or quartz. Insulation layers 120 and 170 may include silicon dioxide (SiO2), a fluorosilicate glass (FSG), a tetraethyl orthosilicate (TEOS) oxide, a silanol (SiOH), a flowable oxide (FOx), a bottom anti-reflective coating (BARC), an anti-reflective coating (ARC), a photoresist (PR), a near-frictionless carbon (NFC), a silicon carbide (SiC), a silicon oxycarbide (SiOC), and/or a carbon-doped silicon oxide (SiCOH). SP waveguide 140 and transparent gate 180 may include any type of metal material including Ag, Al, Au, Ni or Ti. In one embodiment, nano-assembly 130 may be made from III-V and II-VI semiconductor materials. Table 1 below shows examples of III-V and II-VI semiconductor materials with corresponding band gap energy (eV), the lattice constant (a-axis) in angstroms (Å) and crystal structure.

TABLE 1

| Material | Band gap energy (eV) | Lattice constant (Å) | Crystal structure |
| --- | --- | --- | --- |
| CdSe | about 1.732 | about 4.2999 | wurtzite |
| CdS | about 2.428 | about 4.135 | wurtzite |
| ZnS | about 3.67 | about 3.82 | wurtzite |
| MgSe | about 4.05 | about 4.15 | hexagonal |
| MgS | about 4.87 | about 5.203 | rocksalt |
| ZnO | about 3.44 | about 3.25 | wurtzite 1 |
| MgO | about 7.672 | about 4.22 | rocksalt |
| CdO | about 2.28 | about 4.69 | rocksalt |
| BeO | about 10.585 | about 2.698 | wurtzite |

The nano-materials of nano-assembly 130 may be selected depending on the range of visible light spectrum to be detected. In one embodiment, nano-assembly 130 may include CdZnS, which is an alloy of CdS and ZnS. CdS and ZnS are direct band gap semiconductor materials and have a hexagonal crystal structure. The band gap energy of $Cd_xZn_{1-x}S$ may be determined by Equation 3 below.

$$E_g = 3.723 - 1.241x \quad \text{[Equation 3]}$$

When x=0.7, the band gap energy $E_g$ of CdZnS is 2.853 eV, which corresponds to an energy of a photon having a wavelength of about 435 nm (blue spectrum light). In one embodiment, where nano-assembly 130 includes $Cd_xZn_{1-x}S$ (0≦x≦0.5), photodetector 100 may be suitable for detecting the blue spectrum.

In another embodiment, nano-assembly 130 may include CdSSe. CdSSe is an alloy of CdS and CdSe which are direct band gap semiconductor materials and have a hexagonal crystal structure. The band gap energy of $CdSe_xS_{1-x}$ may be determined by Equation 4 below.

$$E_g = 2.482 - 0.75x \quad \text{[Equation 4]}$$

When x=0.15, the band gap energy $E_g$ of CdSSe is 2.37 eV, which corresponds to an energy of a photon having a wavelength of about 520 nm (green spectrum light), and when x=0.7, the band gap energy $E_g$ of CdSSe is 1.957 eV, which corresponds to an energy of a photon having a wavelength of about 633 nm (red spectrum light). That is, nano-assembly 130 including CdSSe may be suitable for detecting both green and red spectrum light. In one embodiment where nano-assembly 130 includes $CdSe_xS_{1-x}$ (0≦x≦0.4), photodetector 100 may be suitable for detecting green spectrum light. In one embodiment where nano-assembly 130 includes $CdSe_xS_{1-x}$ (0.6≦x≦1.0), photodetector 100 may be suitable for detecting red spectrum light. Other appropriate nano-materials(s) may be applied to photodetector 100 for detecting a desired spectrum range.

Figure 8:
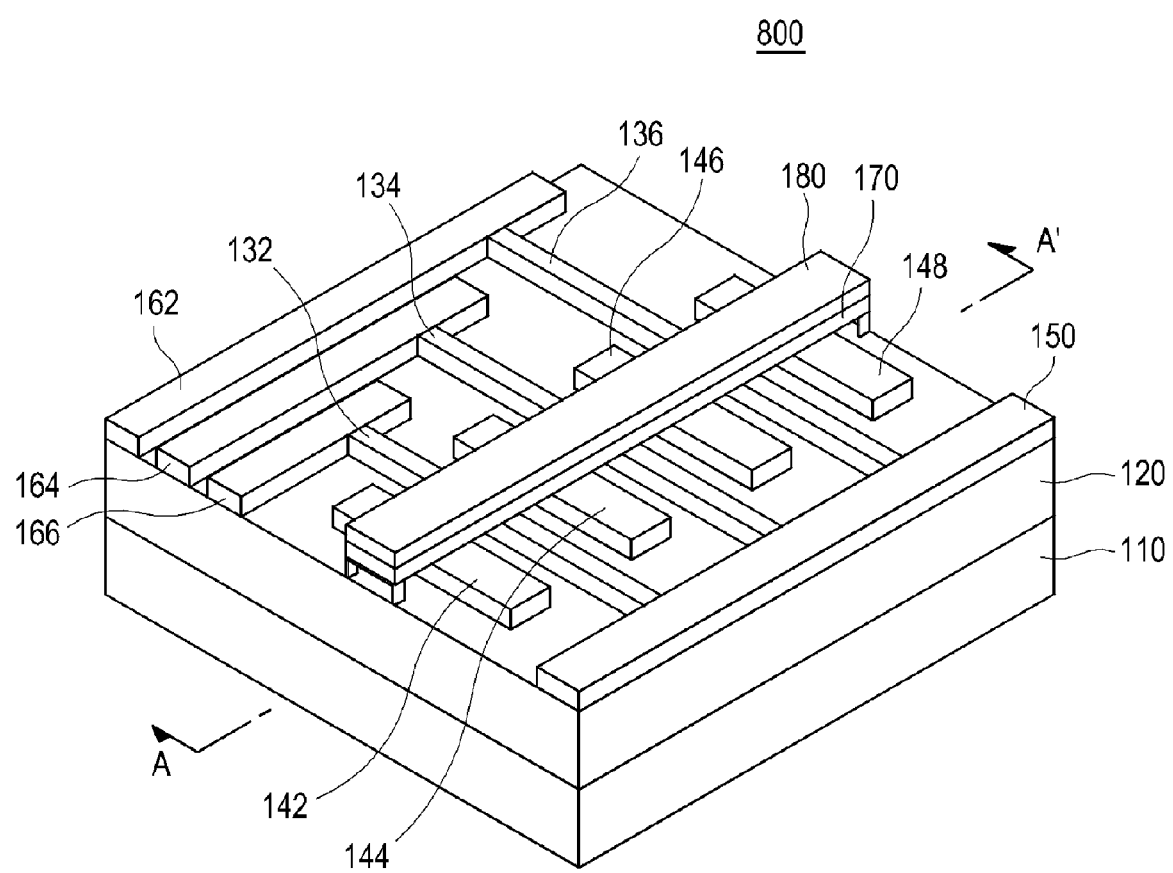
FIG. 8 shows a perspective view of an illustrative embodiment of a photodetector for detecting three different spectrum ranges.

FIG. 8 shows a perspective view of an illustrative embodiment of a photodetector 800 having nano-assemblies spaced apart from SP waveguides. Photodetector 800 includes three nano-assemblies 132, 134 and 136 and four SP waveguides 142, 144, 146 and 148. SP waveguides 144 and 146 may be interposed between nano-assemblies 132, 134 and 136 to create an alternating arrangement of nano-assemblies 132, 134 and 136 and SP waveguides 144 and 146. Further, drains 162, 164 and 166 are separately arranged for each of nano-assemblies 132, 134 and 136. In one embodiment, each of drains 162, 164 and 166 may be connected to different external circuits (not shown) so that a predetermined current through each of nano-assemblies 132, 134 and 136 is detected in the respective external circuits (not shown). In one embodiment, nano-assemblies 132, 134 and 136 may each include different nano-materials, respectively. For example, nano-assemblies 132, 134 and 136 may include $Cd_xZn_{1-x}S$ ($0.5 \leq x \leq 1.0$), $CdSe_xS_{1-x}$ ($0 \leq x \leq 0.4$), and $CdSe_xS_{1-x}$ ($0.6 \leq x \leq 1.0$), respectively In this case, photodetector 800 may be suitable for detecting different color spectrums such as blue, green, or red spectrum light.

Figure 9:
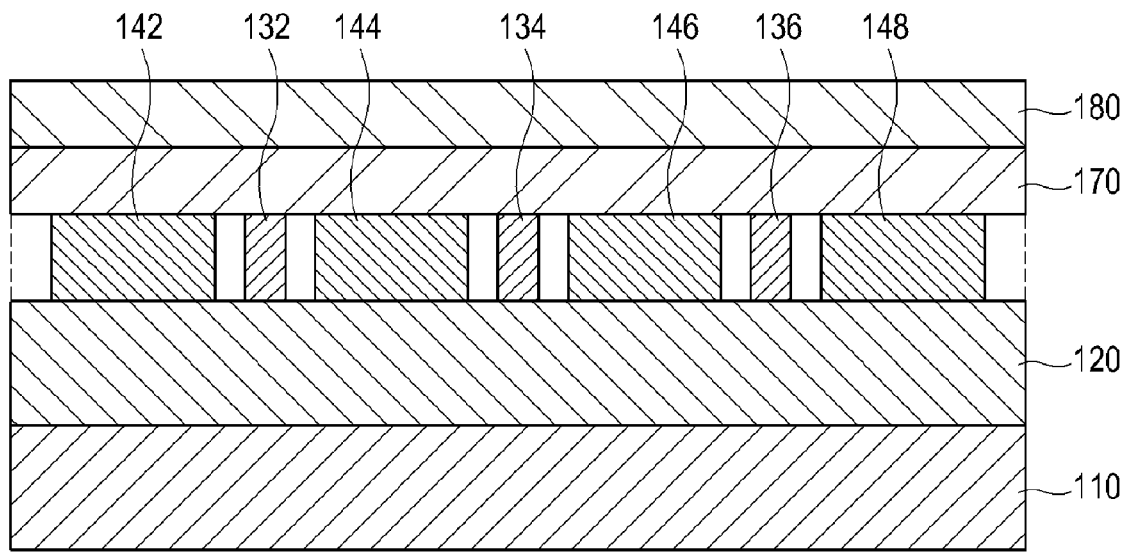
FIG. 9 shows a cross-sectional view of the illustrative embodiment of the photodetector shown in FIG. 8.

FIG. 9 shows a cross-sectional view of photodetector 800, which is taken along line A-A' in FIG. 8. Referring to FIG. 9, photodetector 800 has a laminated structure in which substrate 110, insulation layer 120, nano-assemblies 132, 134, and 136 (or SP waveguides 142, 144, 146, and 148), insulation layer 170 and transparent gate 180 are sequentially stacked. Substrate 110, insulation layers 120 and 170, source 150 and drain 160 may include the same materials as used in FIG. 7. While nano-assemblies 132, 134 and 136 may include nano-materials such as CdSe, CdS, ZnS, MgSe, or ZnS, SP waveguides 140 and transparent gate 180 may include any type of metal material including Ag, Al, Au, Ni, or Ti. In FIG. 9, nano-assemblies 132, 134 and 136 are arranged alternatingly with SP waveguides 142, 144, 146 and 148 on insulation layer 120 so that each of nano-assemblies 132, 134 and 136 is spaced apart from respective adjacent SP waveguides 142, 144, 146 and 148.

Figure 10:
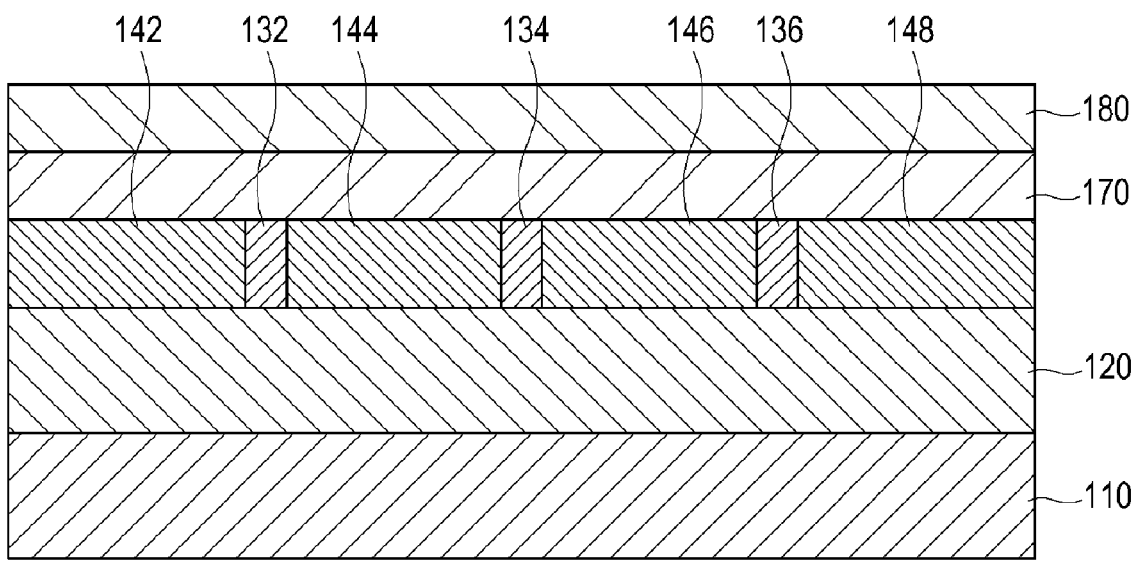
FIG. 10 shows a cross-sectional view of another illustrative embodiment of a photodetector having nano-assemblies placed in contact with SP waveguides.

FIG. 10 shows a cross-sectional view of an illustrative embodiment of a photodetector 1000 having nano-assemblies placed in contact with SP waveguides. Referring to FIG. 10, photodetector 1000 includes nano-assemblies 132, 134 and 136 arranged alternatingly and placed into contact with SP waveguides 142, 144, 146 and 148. The alternating arrangement of nano-assemblies 132, 134 and 136 and SP waveguides 142, 144, 146 and 148 as shown in FIG. 10 provides an interface to receive incident light where dielectric media is sandwiched between metal materials.

FIG. 11 illustrates a flow diagram of an illustrative embodiment of a method for providing a photodetector that detects the visible light spectrum. In block 1110, a source and a drain are provided and may be fabricated using any of a variety of well-known fabrication techniques such as chemical vapor deposition, photolithographic, or etching techniques. In block 1120, the source and the drain are coupled by at least one nano-assembly, which may be grown between the source and the drain using any of a variety of suitable techniques such as epitaxial growth techniques or amorphously deposited by any suitable deposition technique. Illustrative techniques for applying the coatings include molecular beam epitaxy (MBE), metal-organic chemical vapor deposition (MOCVD), chemical vapor deposition (CVD) or plasma enhanced CVD (PECVD).

In block 1130, SP waveguides may be provided and positioned to be juxtaposed to the nano-assembly in a longitudinal direction of nano-assembly so that one SP waveguide is positioned along a first side of nano-assembly and another SP waveguide is positioned along a second side of nano-assembly that is opposite the first side.

Figure 13A:
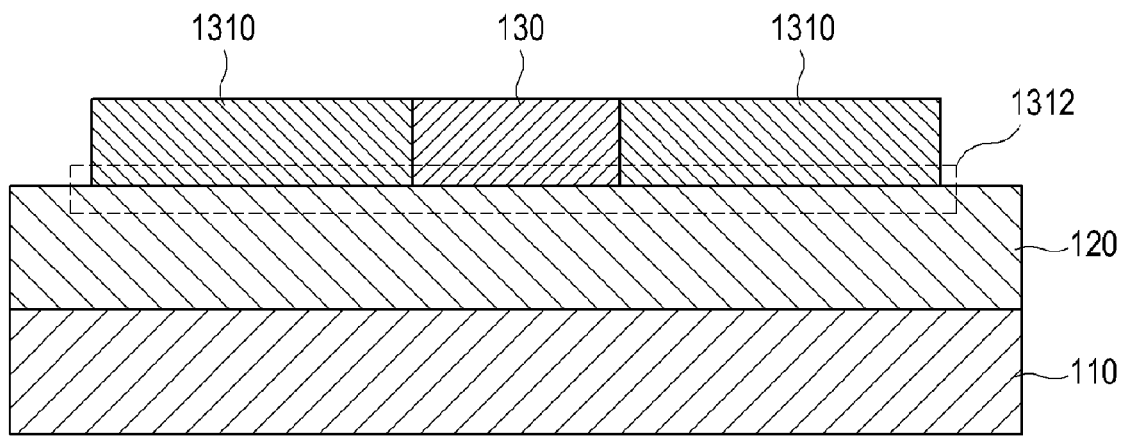
FIG. 13A-13C are a series of diagrams illustrating the method shown in FIG. 12.
Figure 13B:
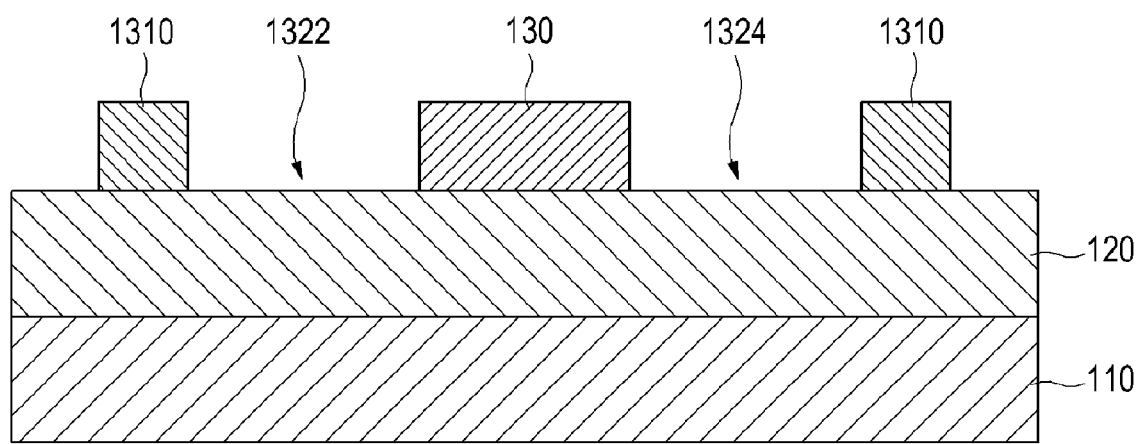
Figure 13C:
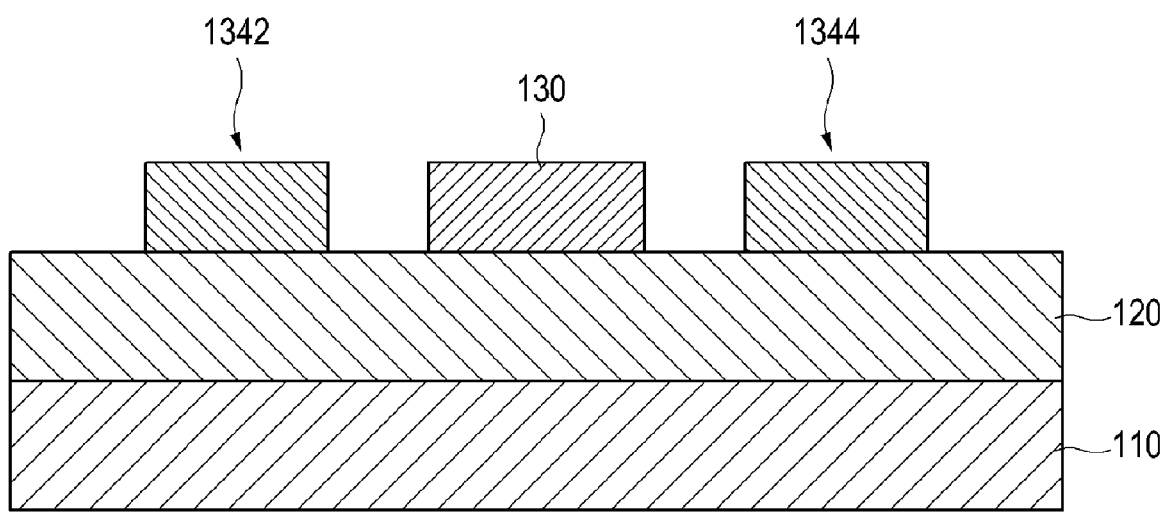

FIG. 12 is a flow diagram of an illustrative embodiment of a method for providing SP waveguides. FIGS. 13A-13C are a series of diagrams illustrating the method shown in FIG. 12. Referring to FIG. 12, in block 1210, as shown in FIG. 13A, a first anti-reflection layer 1310 is formed on a photon receiving surface 1312 on insulation layer 120. In one embodiment, photon receiving surface 1312 may be a portion of the top surface of insulation layer 120. In block 1220, as shown in FIG. 13B, first anti-reflection layer 1310 is patterned to define two elongated holes 1322 and 1324 therein. For example, first anti-reflection layer 1310 may be patterned by first forming a photo mask with patterns corresponding to two elongated holes 1322 and 1324, etching first anti-reflection layer 1110, and then removing the photo mask. First anti-reflection layer 1310 remaining in FIG. 13B may be removed at an appropriate time by suitable methods including etching. In block 1230, as shown in FIG. 13C, metal is deposited into two elongated holes 1322 and 1324 (shown in FIG. 13B) to respectively form two SP waveguides 1342 and 1344 therein. Such deposition may be performed, for example, by using any of a variety of suitable masking and deposition techniques known in the art. SP waveguides 1342 and 1344 may be obtained by using any of a variety of well-known techniques such as metal etching.

Referring again to FIG. 11, after positioning the SP waveguides, in block 1140, a transparent gate may be positioned above or substantially on top of the nano-assembly and at least two SP waveguides. In an illustrative embodiment, prior to positioning the transparent gate, an insulation layer may be placed on the nano-assembly and the SP waveguides. In block 1150, the transparent gate is further arranged to be in proximity to at least one nano-assembly and at least two SP waveguides so as to extend substantially parallel to at least one of the source and the drain.

It should be appreciated that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, it should be appreciated that these terms translate from the plural to the singular and/or from the singular to the plural as is appropriate to the context and/or application. The various singular/plural permutations may be expressly set forth herein for sake of clarity.

It should be further appreciated that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It should be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, it should be recognized that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one would understand the convention (e.g., "a system having at least one of A, B, or C" would include but not be limited to systems that have A alone, B alone, C alone, A and B together, A and C together, B and C together, and/or A, B, and C together, etc.). It should be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, it is recognized that the disclosure is also thereby described in terms of any individual member or subgroup of members of the Markush group.

It should be further understood, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. It should also be understood that all language such as "up to," "at least," and the like include the number recited and refer to ranges which can be subsequently broken down into subranges as discussed above. Finally, it should also be understood that a range includes each individual member. Thus, for example, a group having 1-3 cells refers to groups having 1, 2, or 3 cells. Similarly, a group having 1-5 cells refers to groups having 1, 2, 3, 4, or 5 cells, and so forth. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A photodetector capable of detecting the visible light spectrum, comprising:
  a source disposed on a proximal end of an insulation layer;
  a drain disposed on a distal end of the insulation layer;
  at least one nano-assembly coupling the source and the drain between the proximal and distal ends;
  at least two surface plasmon waveguides positioned between the source and the drain and juxtaposed to the at least one nano-assembly in a longitudinal direction of the at least one nano-assembly to receive photons from incident light and to confine at least a portion of the photons around at least a portion of the nano-assembly; and
  a transparent gate positioned in proximity to the at least one nano-assembly and the at least two surface plasmon waveguides and further being arranged so as to extend substantially parallel to at least one of the source and the drain,
  wherein one of the at least two surface plasmon waveguides is positioned along a first side of the at least one nano-assembly, and another of the at least two surface plasmon waveguides is positioned along a second side of the at least one nano-assembly that is opposite the first side.

2. The photodetector of claim 1, wherein the transparent gate is arranged between the source and the drain.

3. The photodetector of claim 1, wherein the transparent gate is arranged substantially perpendicular with respect to the at least one nano-assembly.

4. The photodetector of claim 1, wherein at least one of the at least two surface plasmon waveguides is in contact with the at least one nano-assembly.

5. The photodetector of claim 1, wherein a plurality of surface plasmon waveguides and nano-assemblies are disposed so that at least some of the least two surface plasmon waveguides are interposed between the nano-assemblies to create an alternating arrangement of the surface plasmon waveguides and the nano-assembly.

6. The photodetector of claim 1, wherein the nano-assembly is configured to have a valence band and a conduction band such that at least one transition of electrons from the valence band to the conduction band corresponds to detection of a photon.

7. The photodetector of claim 1, wherein at least one of the at least two surface plasmon waveguides is spaced-apart in relation to the at least one nano-assembly by several to thousands of nanometers.

8. The photodetector of claim 1, wherein the at least one nano-assembly comprises one of a nano wire, a nanobelt, or a nanorod.

9. The photodetector of claim 1, wherein the at least one nano-assembly is comprised of an array of at least one of a nanowire, a nanobelt, or a nanorod.

10. The photodetector of claim 1 wherein the at least one nano-assembly is selected from the group consisting of II-VI semiconductor compounds and III-V semiconductor compounds.

11. The photodetector of claim 1, wherein the at least one nano-assembly is comprised of $Cd_xZn_{1-x}S$, wherein the value of x is from about 0.5 to about 1.0.

12. The photodetector of claim 1, wherein the at least one nano-assembly is comprised of $CdSe_xS_{1-x}$, wherein the value of x is from about 0 to about 0.4.

13. The photodetector of claim 1, wherein the at least one nano-assembly is comprised of $CdSe_xS_{1-x}$, wherein the value of x is from about 0.6 to about 1.0.

14. The photodetector of claim 1, wherein at least one of the at least two surface plasmon waveguides is fabricated from a metal material.

15. The photodetector of claim 14, wherein the metal material is Ag.

16. The photodetector of claim 1, wherein the transparent gate is configured to have a reverse voltage applied thereto so that the internal field of the at least one nano-assembly is reduced thereby.

17. The photodetector of claim 1, wherein the transparent gate is fabricated from a metal material.

18. The photodetector of claim 1, wherein the visible light spectrum has a wavelength in the range of from about 300 nm to about 800 nm.

19. The photodetector of claim 1, wherein the at least one nano-assembly has a width from about 10 nm to about 500 nm.

20. The photodetector of claim 1, wherein the nano-assembly has a length from about 0.5 μm to about 5 μm.

21. A photodetector capable of detecting the visible light spectrum, comprising:
 a first nano-assembly configured to perform a first spectrum detection;
 a second nano-assembly configured to perform a second spectrum detection;
 a third nano-assembly configured to perform a third spectrum detection;
 a source coupled to a drain by the first, second and the third nano-assemblies;
 at least two surface plasmon waveguides positioned between the source and the drain and juxtaposed to the at least one nano-assembly in a longitudinal direction of the at least one nano-assembly to receive photons from incident light and to confine at least a portion of the photons around at least a portion of the nano-assembly; and
 a transparent gate positioned in proximity to the at least one nano-assembly and the at least two surface plasmon waveguides, and further being arranged to extend substantially parallel to at least one of the source and the drain,
 wherein one of the at least two surface plasmon waveguides is positioned along a first side of the at least one nano-assembly, and another of the at least two surface plasmon waveguides is positioned along a second side of the at least one nano-assembly that is opposite the first side.

22. The photodetector of claim 21, wherein the color detected by the first nano-assembly is blue.

23. The photodetector of claim 21, wherein the color detected by the second nano-assembly is green.

24. The photodetector of claim 21, wherein the color detected by the third nano-assembly is red.

* * * * *

UNITED STATES PATENT AND TRADEMARK OFFICE
CERTIFICATE OF CORRECTION

PATENT NO. : 8,227,793 B2  Page 1 of 1
APPLICATION NO. : 12/498204
DATED : July 24, 2012
INVENTOR(S) : Ahn It is certified that error appears in the above-identified patent and that said Letters Patent is hereby corrected as shown below:

Title Page;

On Page 2, in Field (56), under "OTHER PUBLICATIONS", in Column 2, Line 15, delete "Pysical" and insert -- Physical --, therefor.

On Page 2, in Field (56), under "OTHER PUBLICATIONS", in Column 2, Line 69, delete "Photodectors" and insert -- Photodetectors --, therefor.

On Page 3, in Field (56), under "OTHER PUBLICATIONS", in Column 1, Line 31, delete "reduced-desnsity-operator" and insert -- reduced-density-operator --, therefor.

On Page 3, in Field (56), under "OTHER PUBLICATIONS", in Column 1, Line 35, delete "reduced-desnsity-operator" and insert -- reduced-density-operator --, therefor.

On Page 3, in Field (56), under "OTHER PUBLICATIONS", in Column 2, Line 2, delete "Nanothecnology." and insert -- Nanotechnology. --, therefor.

In Figure 2, Sheet 1 of 11, delete "WAVELEAGTH" and insert -- WAVELENGTH --, therefor.

In Column 10, Line 45, in Claim 8, delete "nano wire," and insert -- nanowire, --, therefor.

In Column 10, Line 50, in Claim 10, delete "1" and insert -- 1, --, therefor.

Signed and Sealed this
Twenty-third Day of October, 2012

David J. Kappos
*Director of the United States Patent and Trademark Office*